(12) United States Patent
Zhu et al.

(10) Patent No.: US 12,652,004 B2
(45) Date of Patent: Jun. 9, 2026

(54) APPARATUS AND METHODS FOR AMPLIFIER LINEARIZATION

(71) Applicant: Skyworks Solutions, Inc., Irvine, CA (US)

(72) Inventors: Yu Zhu, Wellesley, MA (US); Oleksiy Klimashov, Burlington, MA (US); Dylan Charles Bartle, Arlington, MA (US); Paul T. DiCarlo, Marlborough, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 497 days.

(21) Appl. No.: 18/362,232

(22) Filed: Jul. 31, 2023

(65) Prior Publication Data

US 2024/0056035 A1     Feb. 15, 2024

Related U.S. Application Data

(60) Provisional application No. 63/371,277, filed on Aug. 12, 2022.

(51) Int. Cl.
| | |
|---|---|
| *H03F 1/02* | (2006.01) |
| *H03F 1/32* | (2006.01) |
| *H03F 3/24* | (2006.01) |

(52) U.S. Cl.
CPC .............. *H03F 1/32* (2013.01); *H03F 3/245* (2013.01); *H03F 2200/451* (2013.01)

(58) Field of Classification Search
CPC ....... H03F 1/32; H03F 3/245; H03F 2200/451
USPC ........................................ 330/291
See application file for complete search history.

(56) References Cited

U.S. PATENT DOCUMENTS

| | | | | |
|---|---|---|---|---|
| 7,972,915 | B2 * | 7/2011 | Chen ...................... | H10D 84/05 |
| | | | | 257/192 |
| 8,149,027 | B2 * | 4/2012 | Cygan ................... | H03F 3/2173 |
| | | | | 327/423 |
| 9,165,894 | B2 * | 10/2015 | Griffith ............... | H01L 23/4824 |
| 9,705,489 | B2 * | 7/2017 | van Otten ............ | H03K 17/163 |
| 9,793,353 | B1 * | 10/2017 | Tsai ........................ | H10D 30/62 |

(Continued)

FOREIGN PATENT DOCUMENTS

CN         222939926 U   *   6/2025

OTHER PUBLICATIONS

Sheng Jiang, All GaN Integrated Cascode Configuration, Ph.D. Thesis, The University of Sheffield (Year: 2017).*
Sugiyama et al., Stable cascode GaN HEMT operation by direct gate drive, IEEE, 2020 (Year: 2020).*
Brohlin et al., Direct-drive configuration for GaN devices, Texas Instruments, 2018 Texas Instruments Incorporated, SLPY008A (Year: 2018).*
Parker et al., "GaN and GaAs HEMT Channel Conductance Model for Nonlinear Microwave and RF Applications", IEEE 2021 (Year: 2021).*

(Continued)

*Primary Examiner* — Hafizur Rahman
(74) *Attorney, Agent, or Firm* — Knobbe, Martens, Olson & Bear, LLP

(57)         ABSTRACT

Apparatus and methods for amplifier linearization are disclosed. In certain embodiments, an RF amplifier includes an RF input terminal that receives an RF input signal, an RF output terminal that provides an RF output signal, a gallium nitride field-effect transistor (GaN FET) having a gate connected to the RF input terminal and a drain connected to the RF output terminal. The GaN FET amplifies the RF input signal. The RF amplifier further includes a gallium arsenide field-effect transistor (GaAs FET) having a gate connected to the RF input terminal and a drain connected to the RF output terminal. The GaAs FET is operable to linearize the GaN FET.

20 Claims, 18 Drawing Sheets

(56)     References Cited

U.S. PATENT DOCUMENTS

| | | | |
|---|---|---|---|
| 10,050,034 B2 * | 8/2018 | Rose | H10D 62/8325 |
| 12,512,450 B2 * | 12/2025 | Chau | H10W 90/00 |
| 2010/0001701 A1 * | 1/2010 | Cygan | H03F 3/2173 |
| | | | 323/282 |
| 2014/0015609 A1 * | 1/2014 | Vetury | H03F 1/226 |
| | | | 330/277 |
| 2015/0357323 A1 * | 12/2015 | Vorhaus | H01L 23/4824 |
| | | | 257/296 |
| 2018/0006015 A1 * | 1/2018 | Rutter | H10D 89/611 |
| 2018/0138873 A1 | 5/2018 | Arell | |
| 2019/0199084 A1 * | 6/2019 | Bahl | H02H 9/04 |
| 2021/0384875 A1 | 12/2021 | Lyalin et al. | |
| 2022/0262712 A1 * | 8/2022 | Yandoc | H01L 21/4842 |
| 2023/0142553 A1 * | 5/2023 | Chang | H03D 7/14 |

OTHER PUBLICATIONS

Li et al., "A multi-band low-noise transmitter with digital carrier leakage suppression and linearity enhancement", IEEE Transactions on Circuits and Systems—I: Regular Papers, vol. 60(5):1209-1219 (2013).

Saini et al., "Linearity enhancement for GaN HEMT amplifier using parallel transistors with independent gate bias control", IEEE 17th Annual Wireless and Microwave Technology Conference, pp. 1-3 (Apr. 11-13, 2016).

* cited by examiner mXn DL MIMO nXm UL MIMO

E pHEMT RF SWING < GaN1 RF SWING

APPARATUS AND METHODS FOR AMPLIFIER LINEARIZATION

CROSS-REFERENCE TO RELATED APPLICATIONS

This application claims the benefit of priority under 35 U.S.C. § 119 of U.S. Provisional Patent Application No. 63/371,277, filed Aug. 12, 2022 and titled "APPARATUS AND METHODS FOR AMPLIFIER LINEARIZATION," which is herein incorporated by reference in its entirety.

BACKGROUND

Technical Field

Embodiments of the invention relate to electronic systems, and in particular, to radio frequency (RF) electronics.

Description of Related Technology

Radio frequency (RF) amplifiers can be used to boost the amplitude of an RF signal. Examples of RF communication systems with one or more RF amplifiers include, but are not limited to, mobile phones, tablets, base stations, network access points, customer-premises equipment (CPE), laptops, and wearable electronics.

RF amplifiers can be used to amplify RF signals of a wide range of frequencies. For example, RF signals are in a frequency range of about 30 kHz to 300 GHz, such as in the range of about 410 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a radio frequency amplifier. The radio frequency amplifier includes a radio frequency input terminal configured to receive a radio frequency input signal, a radio frequency output terminal configured to output a radio frequency output signal, a gallium nitride field-effect transistor having a gate connected to the radio frequency input terminal and a drain connected to the radio frequency output terminal, the gallium nitride field-effect transistor operable to amplify the radio frequency input signal, and a gallium arsenide field-effect transistor having a gate connected to the radio frequency input terminal and a drain connected to the radio frequency output terminal, the gallium arsenide field-effect transistor operable to linearize the gallium nitride field-effect transistor.

In some embodiments, the radio frequency amplifier further includes an input power splitter configured to split the radio frequency input signal into a first input signal component for the gate of the gallium nitride field-effect transistor and a second input signal component for the gate of the gallium arsenide field-effect transistor. According to a number of embodiments, the input power splitter provides a greater proportion of a signal power of the radio frequency signal to the gate of the gallium nitride field-effect transistor relative to the gate of the gallium arsenide field-effect transistor. In accordance with several embodiments, the input power splitter has an asymmetric power ratio of at least 5 to 1. According to various embodiments, the radio frequency amplifier further includes an output power splitter configured to combine a first output signal component from the drain of the gallium nitride field-effect transistor and a second output signal component from the drain of the gallium arsenide field-effect transistor.

In several embodiments, the radio frequency amplifier further includes a first gate bias circuit configured to bias the gate of the gallium nitride field-effect transistor and a second gate bias circuit configured to bias the gate of the gallium arsenide field-effect transistor. According to a number of embodiments, the first gate bias circuit biases the gate of the gallium nitride field-effect transistor with a greater on voltage than the second gate bias circuit biases the gate of gallium arsenide field-effect transistor.

In some embodiments, the gallium arsenide field-effect transistor is a pseudomorphic high electron mobility transistor.

In various embodiments, the gallium arsenide field-effect transistor is a depletion type device.

In several embodiments, the gallium arsenide field-effect transistor is an enhancement type device.

In some embodiments, the drain of the gallium nitride field-effect transistor receives a first power supply voltage and a drain of the gallium arsenide field-effect transistor receives a second power supply voltage that is less than the first power supply voltage.

In certain embodiments, the present disclosure relates to a method of radio frequency amplification. The method includes receiving a radio frequency input signal at a radio frequency input terminal, amplifying the radio frequency input signal using a gallium nitride field-effect transistor having a gate connected to the radio frequency input terminal and a drain connected to a radio frequency output terminal, linearizing the gallium nitride field-effect transistor using a gallium arsenide field-effect transistor having a gate connected to the radio frequency input terminal and a drain connected to the radio frequency output terminal, and outputting a radio frequency output signal from the radio frequency output terminal.

In certain embodiments, the present disclosure relates to a mobile device. The mobile device includes a transceiver and a front-end system coupled to the transceiver. The front-end system includes a radio frequency amplifier that includes a radio frequency input terminal configured to receive a radio frequency input signal, a radio frequency output terminal configured to output a radio frequency output signal, a gallium nitride field-effect transistor having a gate connected to the radio frequency input terminal and a drain connected to the radio frequency output terminal, and a gallium arsenide field-effect transistor having a gate connected to the radio frequency input terminal and a drain connected to the radio frequency output terminal. The gallium nitride field-effect transistor operable to amplify the radio frequency input signal, and the gallium arsenide field-effect transistor operable to linearize the gallium nitride field-effect transistor.

In some embodiments, the radio frequency amplifier further includes an input power splitter configured to split the radio frequency input signal into a first input signal component for the gate of the gallium nitride field-effect transistor and a second input signal component for the gate of the gallium arsenide field-effect transistor. According to a number of embodiments, the input power splitter provides a greater proportion of a signal power of the radio frequency signal to the gate of the gallium nitride field-effect transistor relative to the gate of the gallium arsenide field-effect transistor. In accordance with several embodiments, the input power splitter has an asymmetric power ratio of at least 5 to 1. According to various embodiments, the radio frequency amplifier further includes an output power splitter configured to combine a first output signal component from the drain of the gallium nitride field-effect transistor and a second output signal component from the drain of the gallium arsenide field-effect transistor.

In various embodiments, the radio frequency amplifier further includes a first gate bias circuit configured to bias the gate of the gallium nitride field-effect transistor and a second gate bias circuit configured to bias the gate of the gallium arsenide field-effect transistor. According to a number of embodiments, the first gate bias circuit biases the gate of the gallium nitride field-effect transistor with a greater on voltage than the second gate bias circuit biases the gate of gallium arsenide field-effect transistor.

In several embodiments, the gallium arsenide field-effect transistor is a pseudomorphic high electron mobility transistor.

In some embodiments, the gallium arsenide field-effect transistor is a depletion type device.

In several embodiments, the gallium arsenide field-effect transistor is an enhancement type device.

In various embodiments, the drain of the gallium nitride field-effect transistor receives a first power supply voltage and a drain of the gallium arsenide field-effect transistor receives a second power supply voltage that is less than the first power supply voltage.

In a number of embodiments, the mobile device further includes an antenna configured to provide the radio frequency input signal to the radio frequency amplifier.

In several embodiments, the mobile device further includes an antenna configured to transmit the radio frequency output signal.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
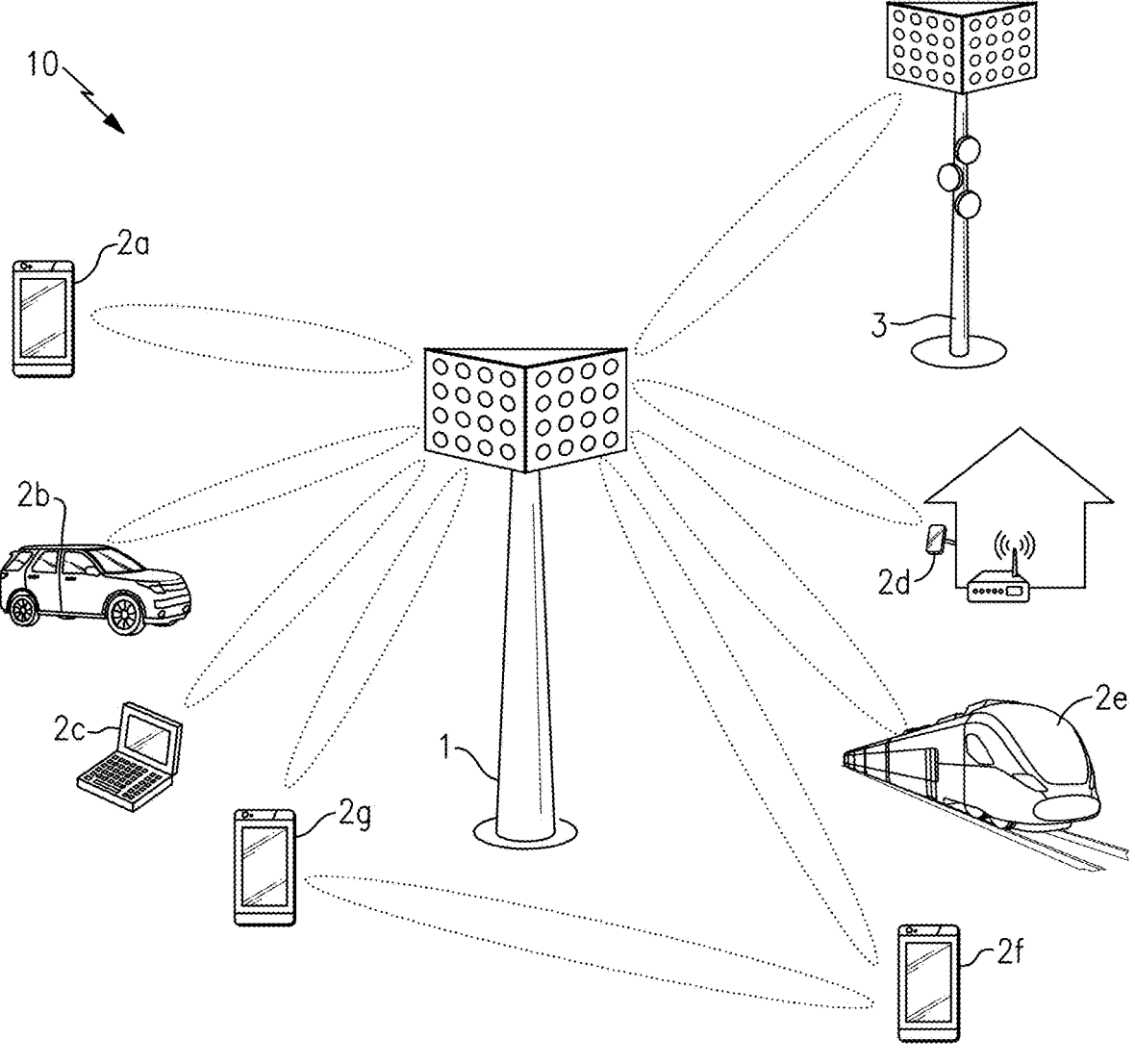
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 20.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
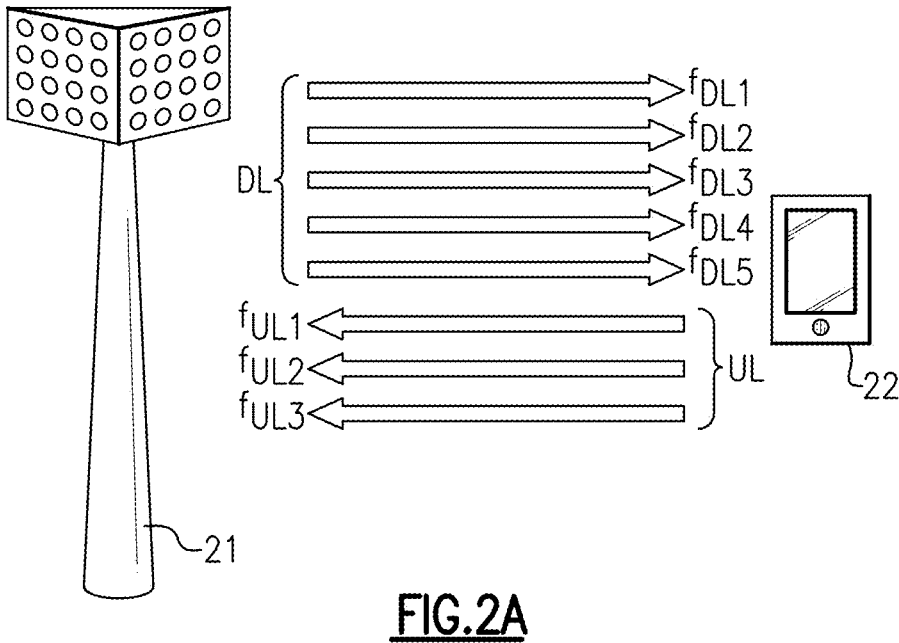
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
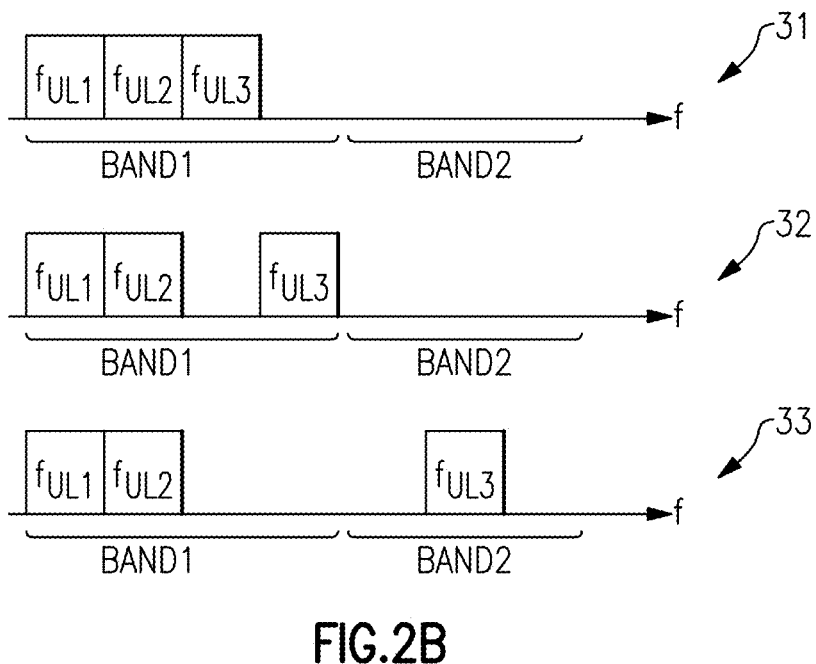
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier full, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
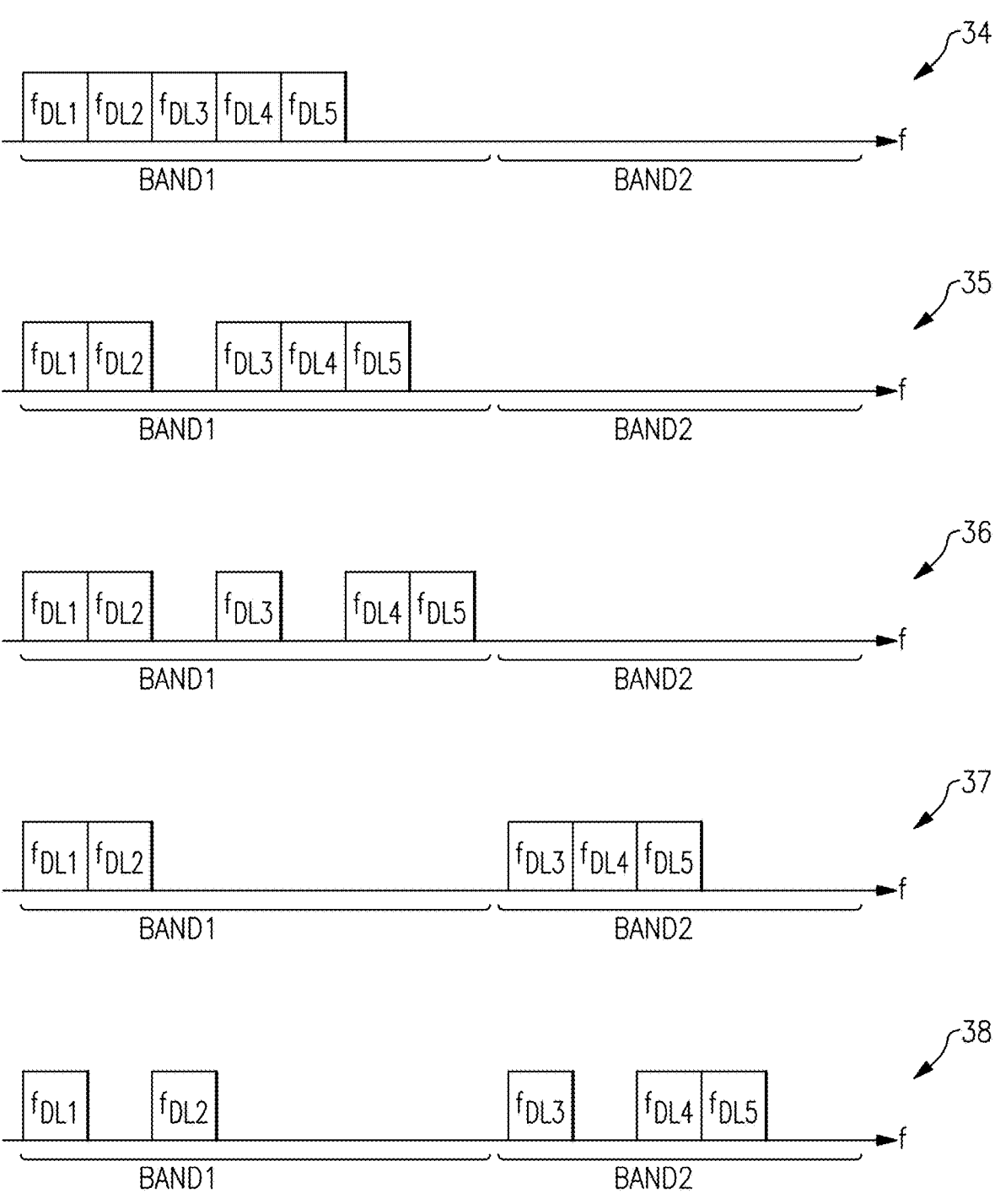
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
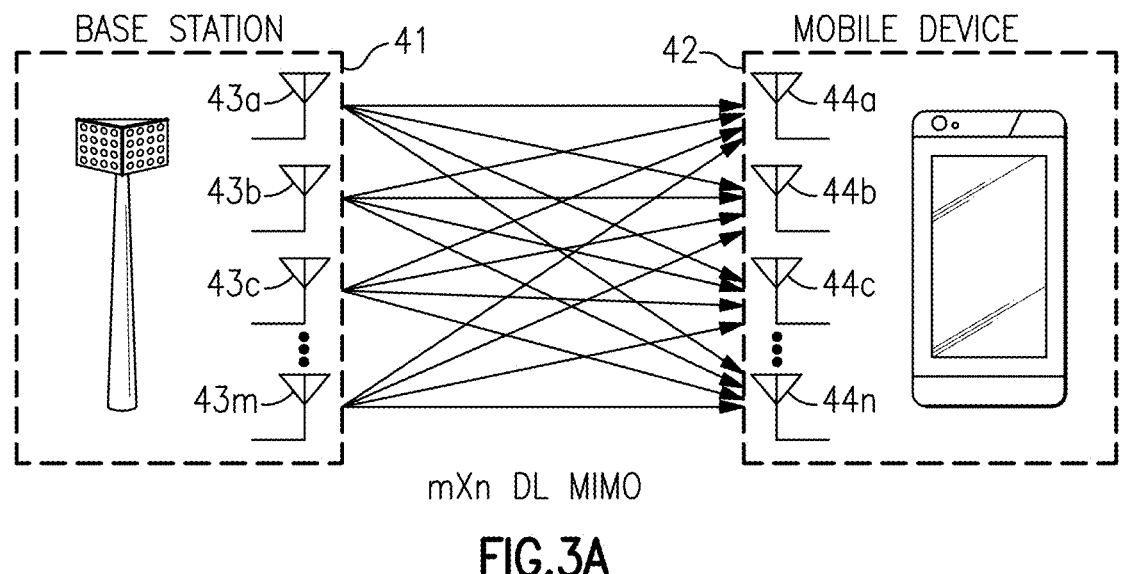
FIG. 3A is a schematic diagram of one example of a downlink channel using multi-input and multi-output (MIMO) communications.
Figure 3B:
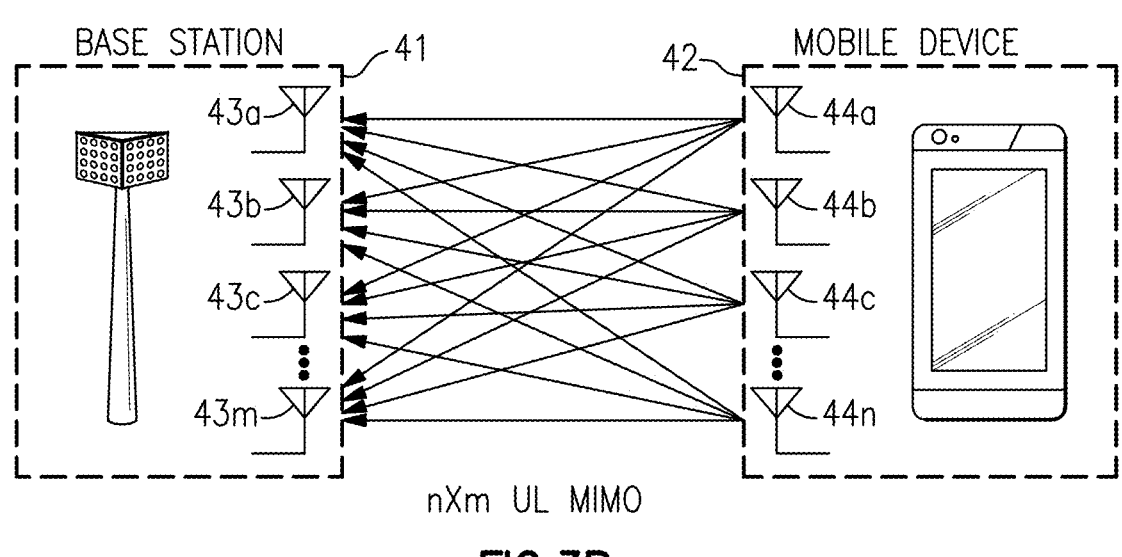
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
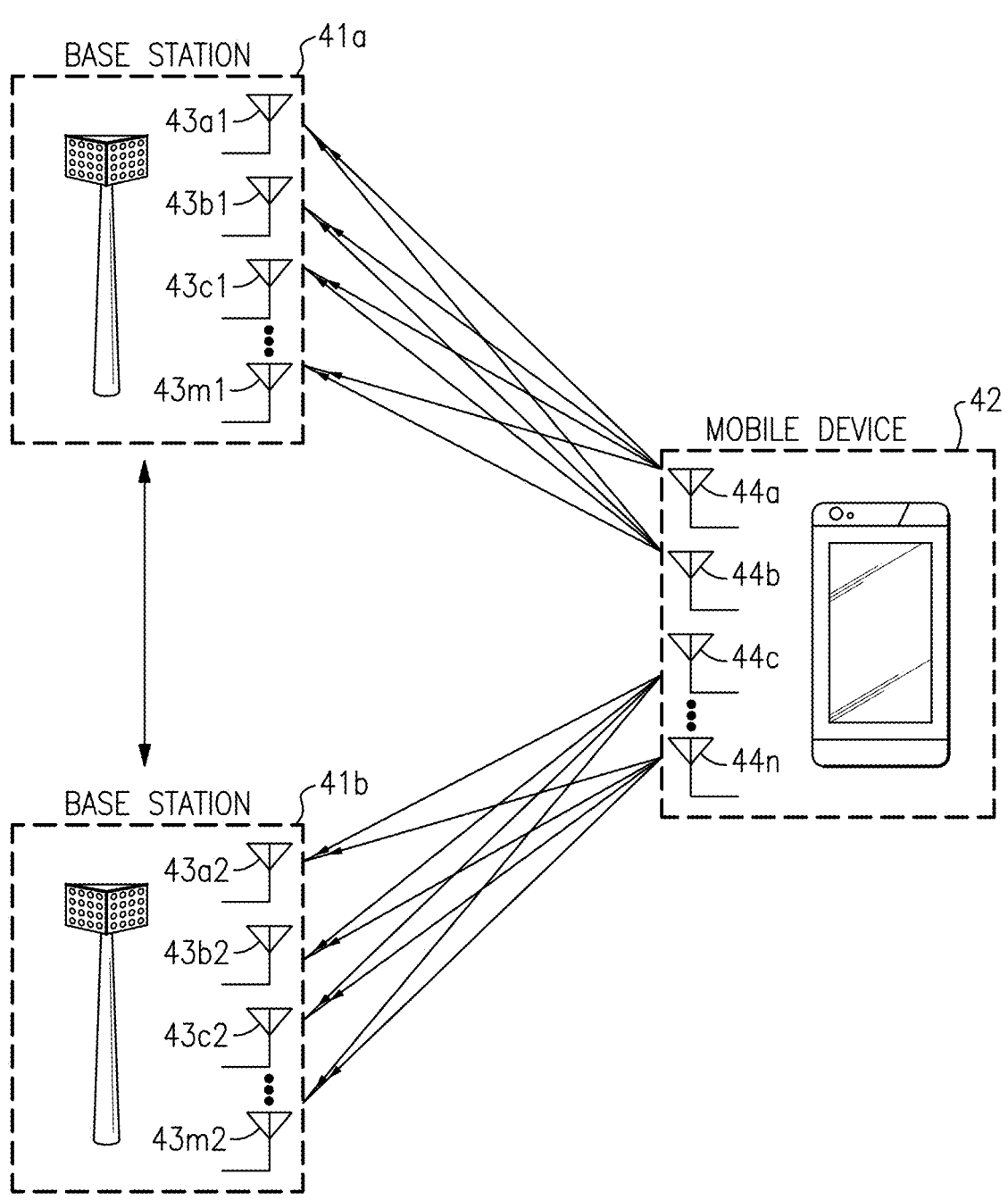
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

Figure 4A:
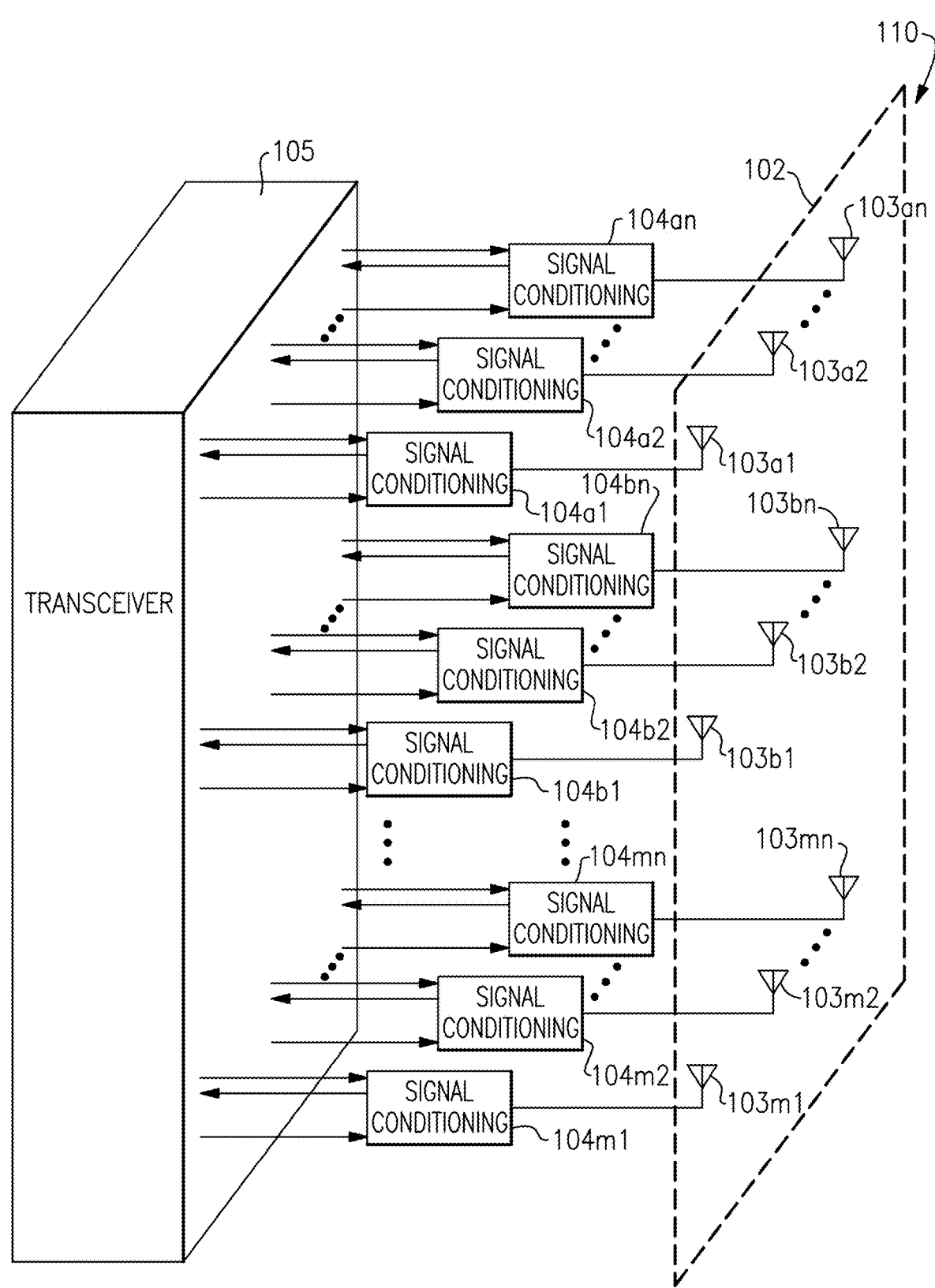
FIG. 4A is a schematic diagram of one example of a communication system that operates with beamforming.

FIG. 4A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using milli-meter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

Figure 4B:
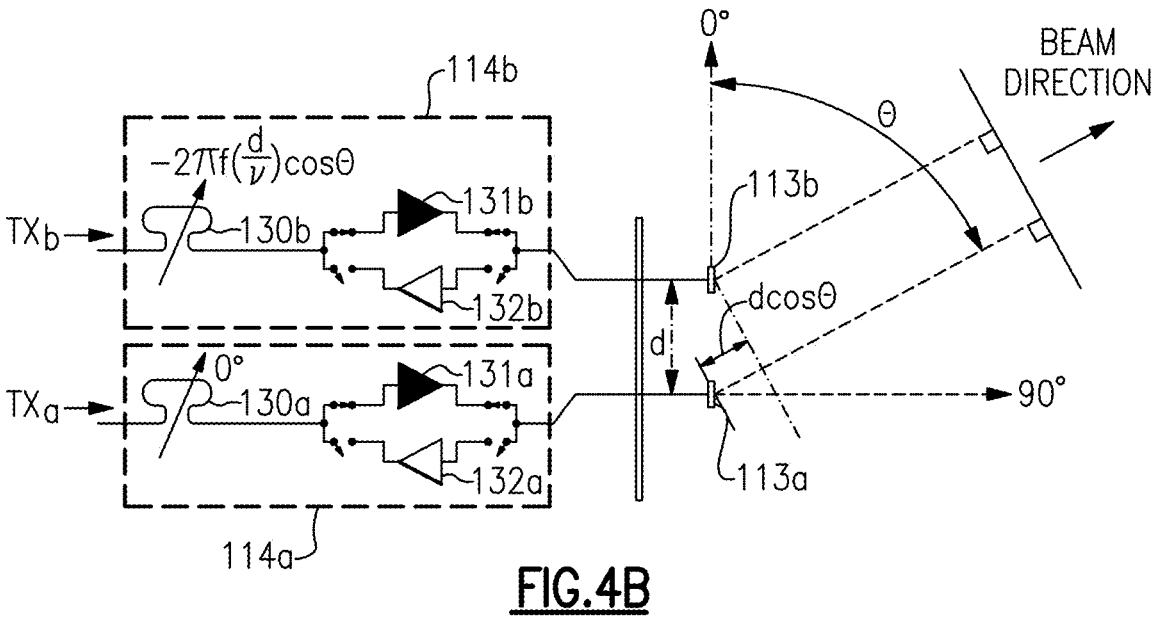
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 4B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and 7C is the mathematic constant pi.

In certain implementations, the distance d is implemented to be about ½ λ, where λ is the wavelength of the fundamental component of the transmit signal. In such implementations, the second phase shifter 130b can be controlled to provide a phase shift of about $-\pi\cos\theta$ radians to achieve a transmit beam angle θ.

Accordingly, the relative phase of the phase shifters 130a, 130b can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

Figure 4C:
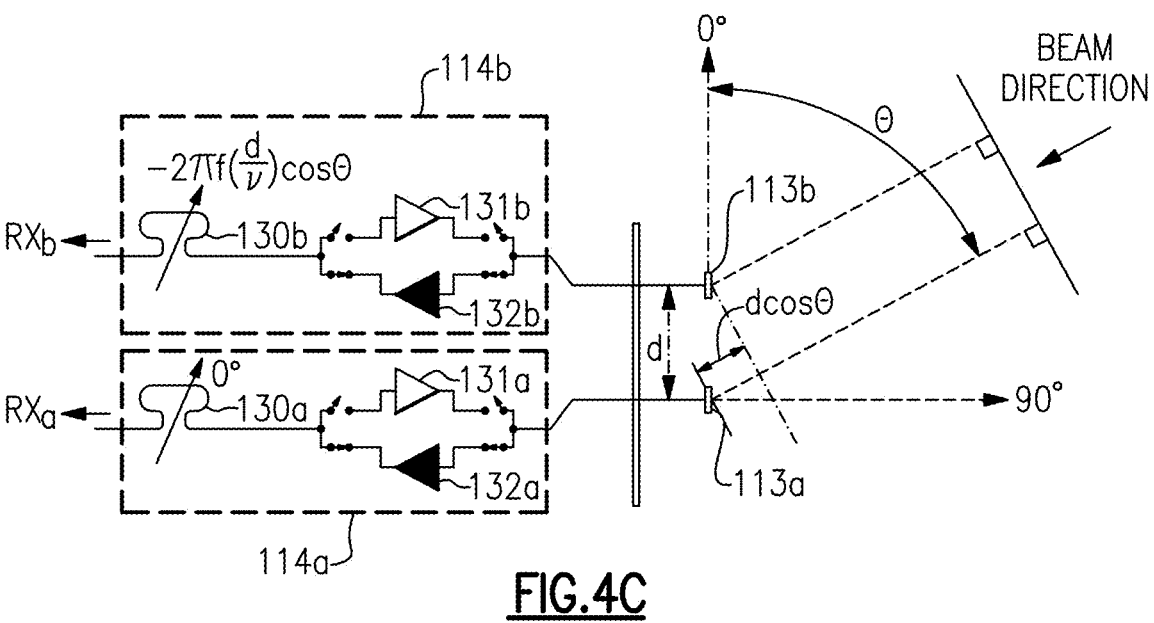
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130a and the second phase shifter 130b can be selected to about equal to $-2\pi f(d/v)\cos\theta$ radians to achieve a desired receive beam angle θ. In implementations in which the distance d corresponds to about ½ λ, the phase difference can be selected to about equal to $-\pi\cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Examples of RF Amplifier Linearization

Apparatus and methods for amplifier linearization are disclosed. In certain embodiments, an RF amplifier includes an RF input terminal that receives an RF input signal, an RF output terminal that provides an RF output signal, a gallium nitride field-effect transistor (GaN FET) having a gate connected to the RF input terminal and a drain connected to the RF output terminal. The GaN FET amplifies the RF input signal. The RF amplifier further includes a gallium arsenide field-effect transistor (GaAs FET) having a gate connected to the RF input terminal and a drain connected to the RF output terminal. The GaAs FET is operable to linearize the GaN FET.

By implementing the RF amplifier in this manner, linearization is improved. For example, the GaAs FET can serve to cancel third-order harmonics of the GaN FET, thereby improving IM3 and/or other performance parameters of the RF amplifier relative to an implementation with only the GaN FET. For example, the GaAs FET and GaN FET operate with derivative superposition to provide a linearity enhancement.

Furthermore, since the addition of the GaAs FET has a relatively small impact on overall design cost and complexity, the improvement in linearization is achieved with low cost.

In certain implementations, the GaAs FET can be implemented as a pseudomorphic high electron mobility transistor (pHEMT), which can be an enhancement mode device or a depletion mode device.

The GaN FET and the GaAs FET can be separately biased at the gate and operate using different power supply voltage levels at the drain to achieve desired performance parameters.

In certain implementations, an input power splitter is included between the RF input terminal and the gates of the GaN FET and the GaAs FET, and an output power combiner in included between the drains of the GaN FET and the GaAs FET and the RF output terminal. Additionally, the input power splitter and the output power combiner can each be implemented with an asymmetric power ratio for power splitting/combining such that a greater proportion of the signal power is handled by the GaN FET.

The RF amplifiers herein can be used for a wide variety of applications including, for example, as a power amplifier or a low noise amplifier.

Figure 5:
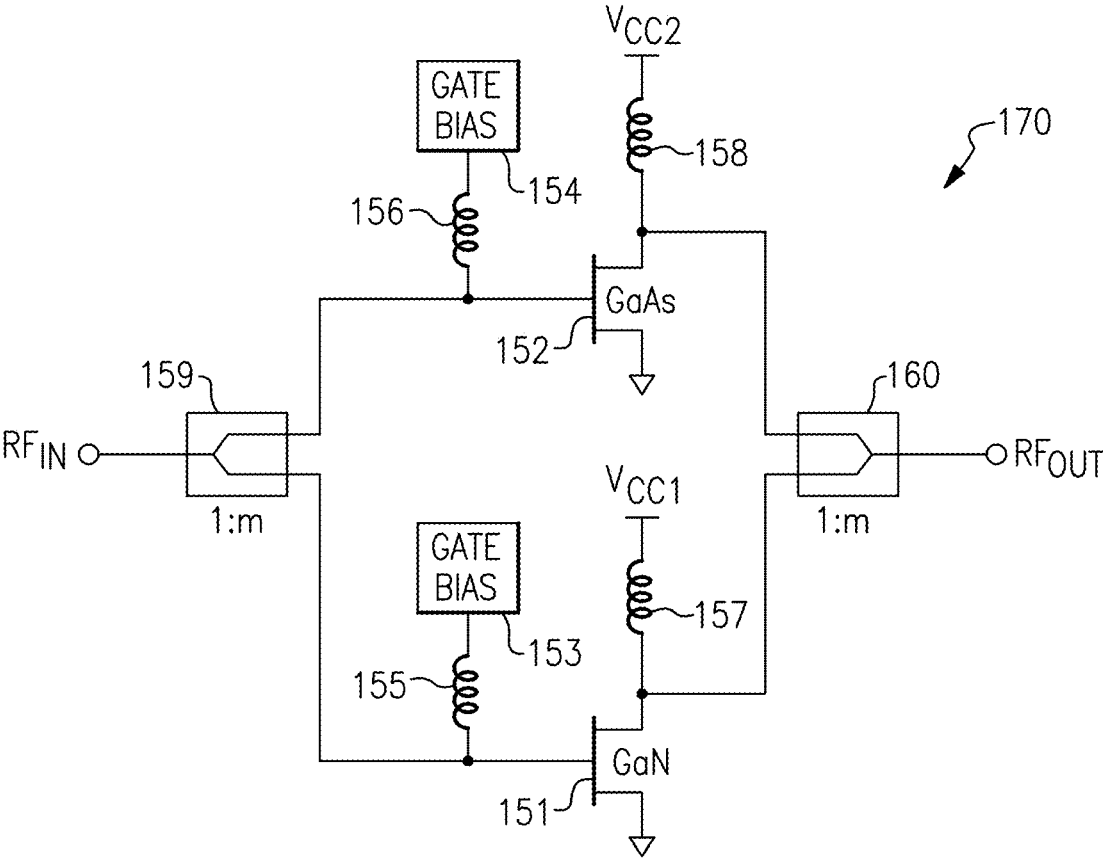
FIG. 5 is a schematic diagram of one embodiment of an RF amplifier.

FIG. 5 is a schematic diagram of one embodiment of an RF amplifier 170. The RF amplifier 170 includes an RF input terminal $RF_{IN}$, an RF output terminal $RF_{OUT}$, a GaN FET 151, a GaAs FET 152, a first gate bias circuit 153, a second gate bias circuit 154, a first gate bias inductor 155, a second gate bias inductor 156, a first choke inductor 157, a second choke inductor 158, an input power splitter 159, and an output power splitter 160.

The RF input terminal RF IN receives an RF input signal, which is split by the input power splitter 159 to provide a first RF input signal component to a gate of the GaN FET 151 and a second RF input signal component to a gate of the GaAs FET 152. The input power splitter 159 is implemented with an asymmetric power ratio of 1 to m (1:m), where m is greater than 1 to thereby provide a greater amount of power to the gate of the GaN FET 151 relative to the gate of GaAs FET 152. In certain implementations, m is greater than or equal to 5.

With continuing reference to FIG. 5, the gate of the GaN FET 151 is biased by the first gate bias circuit 153 through the first gate bias inductor 155. Additionally, the gate of the GaAs FET 152 is biased by the second gate bias circuit 154 through the second gate bias inductor 156. Although an example with gate bias inductors is shown, other components (for example, a resistor, a capacitor, an inductor, or a combination thereof) can be used as a gate bias impedance for biasing a gate of a FET.

The first gate bias circuit 153 and the second gate bias circuit 154 are used generate separate gate bias voltages for the GaN FET 151 and for the GaAs FET 152. In certain implementations, the GaN FET 151 is biased with a greater on voltage (gate-to-source voltage minus threshold voltage, or $V_{GS}$-$V_{TH}$) relative to the GaAs FET 152, such that the GaAs FET 152 is weakly turned on.

In certain implementations, the RF output terminal is $RF_{OUT}$ connected to a load, for example, a 50 Ohm load. In one example, a transceiver provides an RF transmit signal to the RF input terminal $RF_{IN}$, and the RF output terminal $RF_{OUT}$ is connected to an antenna. To aid in provide impedance matching, input matching circuitry can be included at the RF input terminal $RF_{IN}$ and/or output matching circuitry can be included at the RF output terminal $RF_{OUT}$.

In the illustrated embodiment, the GaN FET 151 and the GaAs FET 152 each include a source connected to a ground voltage, and a gate that receives an input signal for amplification. Thus, the GaN FET 151 and the GaAs FET 152 are connected in a common source transistor configuration, in the illustrated embodiment. In another embodiment, a cascode transistor configuration is used in which one or more cascode transistors are included at each of the drain of the GaN FET 151 and the drain of the GaAs FET 152. The cascode transistors can be of a variety of transistor types, such as GaN, GaAs, or a combination thereof.

The first choke inductor 157 provides a first power supply voltage $V_{CC1}$ to the drain of the GaN FET 151, while the second choke inductor 158 provides a second power supply voltage $V_{CC2}$ to the drain of the GaAs FET 152. The first power supply voltage $V_{CC1}$ and the second power supply voltage $V_{CC2}$ can be generated by any suitable power management circuit (for example, using switching regulators, such as buck converters and/or boost converters) and need not have equal voltage. In certain implementations, the first power supply voltage $V_{CC1}$ is greater than the second power supply voltage $V_{CC2}$.

With continuing reference to FIG. 5, the output power combiner 160 combines a first RF output signal component from the drain of the GaN FET 151 with a second RF output signal component from the drain of the GaN FET 152 to generate an RF output signal that is provided to the RF output terminal $RF_{OUT}$. As shown in FIG. 5, the output power combiner 160 is implemented with a ratio of 1:m, where m is greater than 1 such that the GaN FET 151 provides a greater contribution of output power relative to the GaAs FET 152.

In certain embodiments herein, the path through the GaAs FET 152 is implemented to generate the second RF output signal component such that a third-order harmonic of the first RF output signal component is suppressed or canceled. Thus, at a third order harmonic frequency, the second RF output signal can have about equal magnitude but opposite phase as the first RF output signal. Accordingly, IM3 can be improved.

Figure 6:
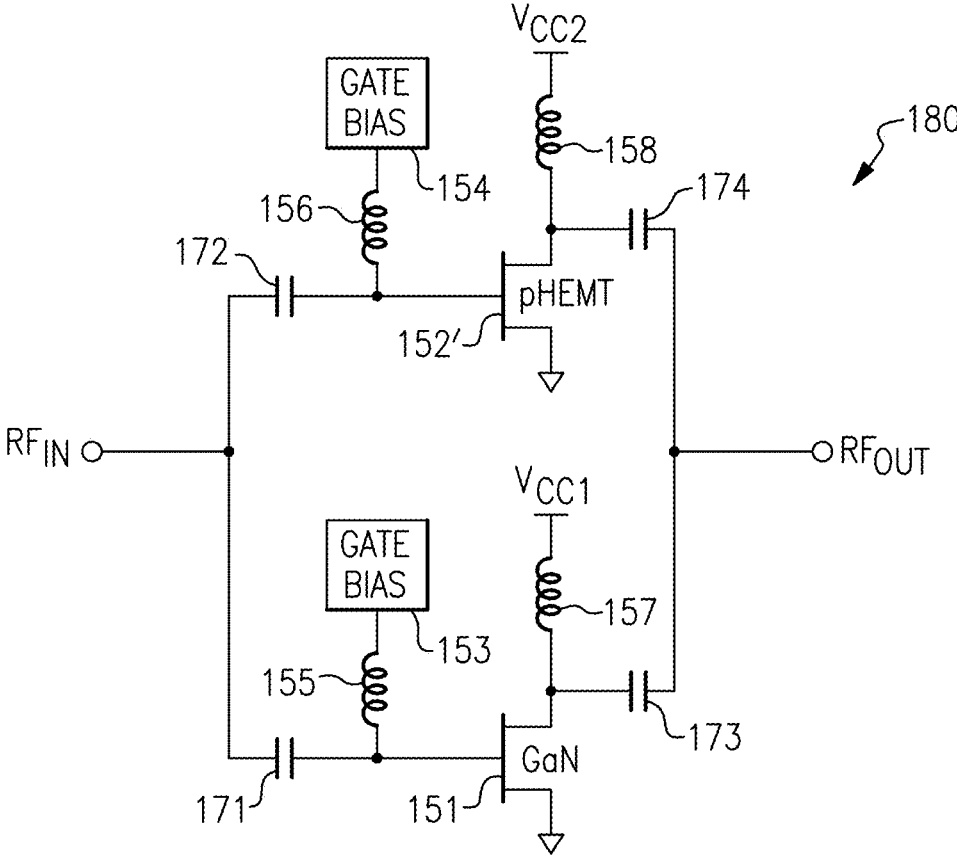
FIG. 6 is a schematic diagram of another embodiment of an RF amplifier.

FIG. 6 is a schematic diagram of another embodiment of an RF amplifier 180. The RF amplifier 180 includes an RF input terminal $RF_{IN}$, an RF output terminal $RF_{OUT}$, a GaN FET 151, a GaAs pHEMT 152', a first gate bias circuit 153, a second gate bias circuit 154, a first gate bias inductor 155, a second gate bias inductor 156, a first choke inductor 157, a second choke inductor 158, a first input capacitor 171, a second input capacitor 172, a first output capacitor 173, and a second output capacitor 174.

The RF amplifier 180 of FIG. 6 is similar to the RF amplifier 170 of FIG. 5, except that the RF amplifier 180 depicts a specific implementation of a GaAs FET and uses a pair of input capacitors for input power splitting and a pair of output capacitors for output power splitting. Any of the embodiments herein can include a GaAs pHEMT. Additionally or alternatively, any of the embodiments herein can use capacitors for power combining or power splitting. For example, by sizing each capacitor in a pair of capacitors in a particular manner, a desired ratio for power splitting or combining can be achieved.

Although an example with capacitors for power splitting and power combining is shown, any suitable power combining/power splitting components can be used in accordance with the RF amplifiers herein.

Figure 7A:
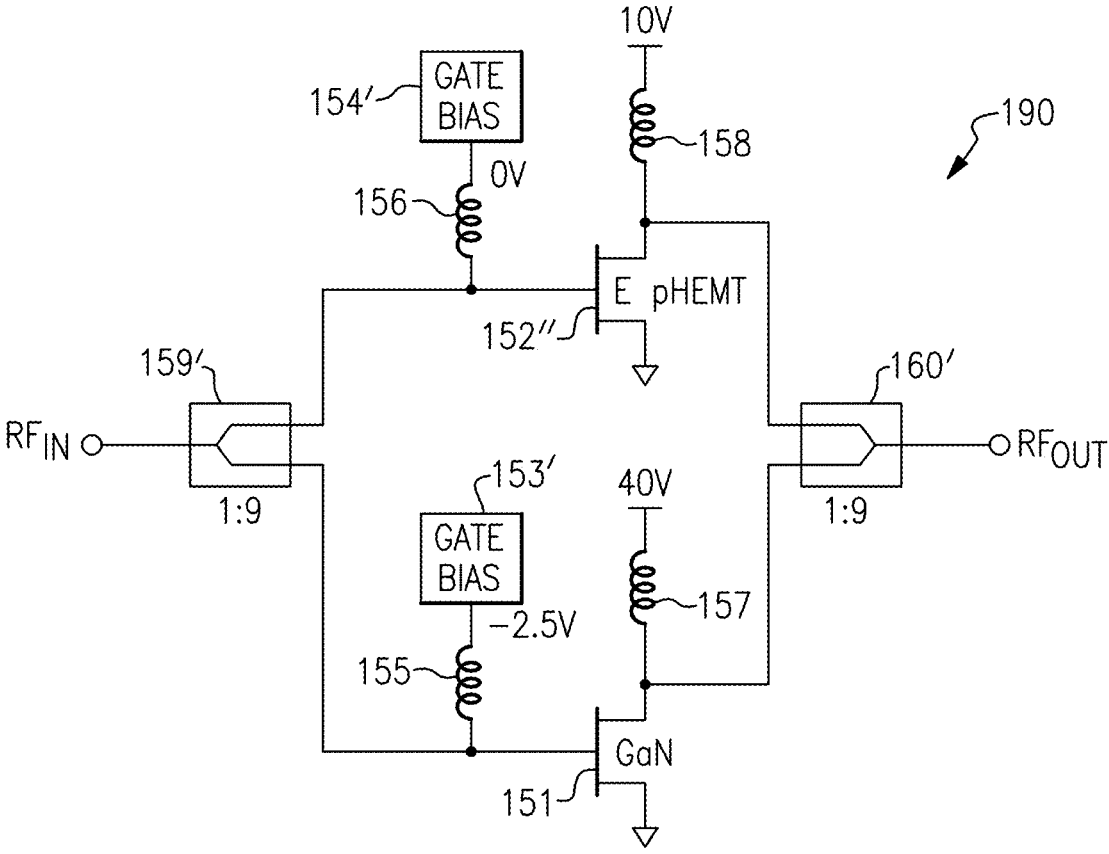
FIG. 7A is a schematic diagram of another embodiment of an RF amplifier.

FIG. 7A is a schematic diagram of another embodiment of an RF amplifier 190. The RF amplifier 190 includes an RF input terminal $RF_{IN}$, an RF output terminal $RF_{OUT}$, a GaN FET 151, an enhancement mode (normally off when $V_{GS}$=0V) GaAs pHEMT 152'', a first gate bias circuit 153', a second gate bias circuit 154', a first gate bias inductor 155, a second gate bias inductor 156, a first choke inductor 157, a second choke inductor 158, an input power splitter 159', and an output power splitter 160'.

In comparison to the RF amplifier 170 of FIG. 5, the RF amplifier 190 of FIG. 7A includes a specific implementation in which the GaAs FET is an enhancement mode GaAs pHEMT 152''. Additionally, the input power splitter and output power combiner have a 1:9 ratio. Furthermore, specific biasing conditions are depicted, including Vg=−2.5V for the gate of the GaN FET 151, $V_{CC1}$=40V for the drain of the GaN FET 151, Vg=0V for the gate of the enhancement mode GaAs pHEMT 152'', and $V_{CC2}$=10V for the drain of the enhancement mode GaAs pHEMT 152''.

In the illustrated embodiment, the enhancement mode GaAs pHEMT 152'' has a low gate bias, but weakly turns on for at least a portion of the RF signal cycle. The current injected by the enhancement mode GaAs pHEMT 152'' provides cancellation of a signal component at a third order harmonic frequency, thereby improving IM3.

Figure 7B:
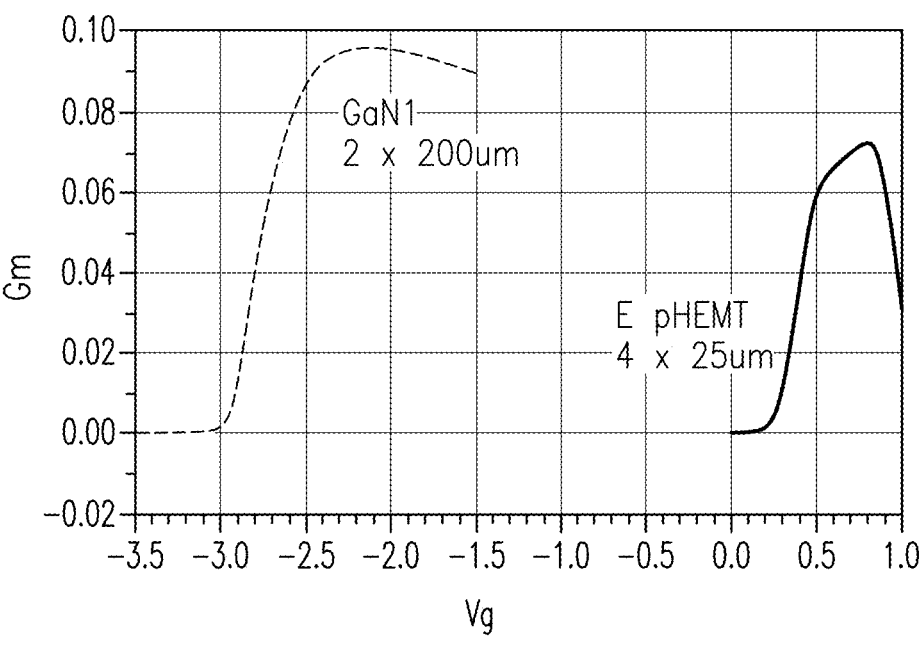
FIG. 7B is a graph of one example of transconductance at fundamental frequency versus gate bias voltage for the RF amplifier of FIG. 7A.

FIG. 7B is a graph of one example of transconductance (Gm) at fundamental frequency versus gate bias voltage (Vg) for the RF amplifier 190 of FIG. 7A in which the GaN FET 151 has width 2×200 micrometers and the enhancement mode GaAs FET 152'' has a width of 4×25 micrometers.

Figure 7C:
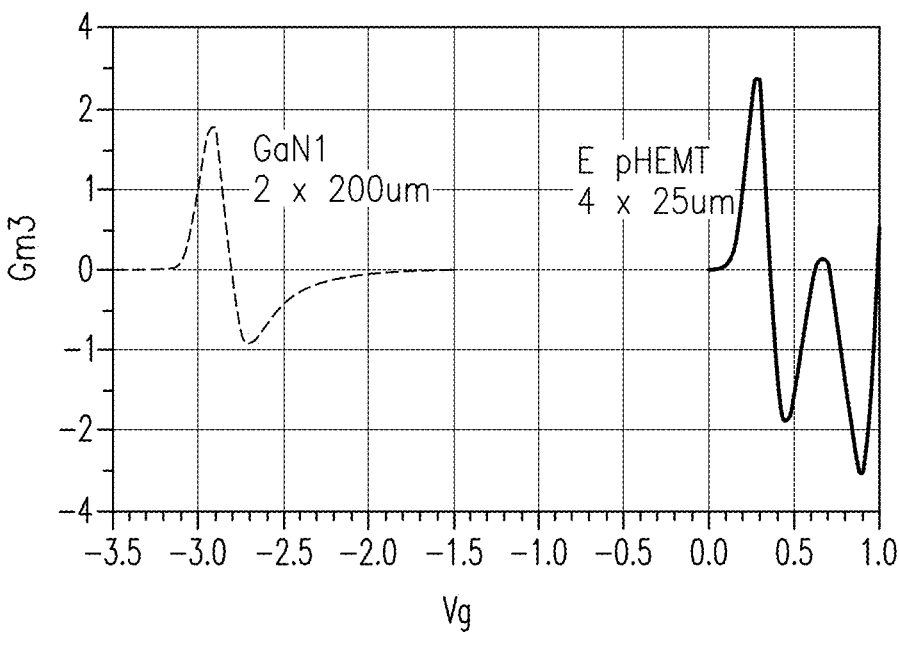
FIG. 7C is a graph of one example of transconductance at third-order harmonic frequency versus gate bias voltage for the RF amplifier of FIG. 7A.

FIG. 7C is a graph of one example of transconductance at third-order harmonic frequency (Gm3) versus gate bias voltage for the RF amplifier 190 of FIG. 7A.

With reference to FIGS. 7B and 7C, by suitable selection of the gate bias voltages for the GaN FET 151 and the enhancement mode GaAs FET 152'', cancellation of Gm3 can be achieved.

Figure 7D:
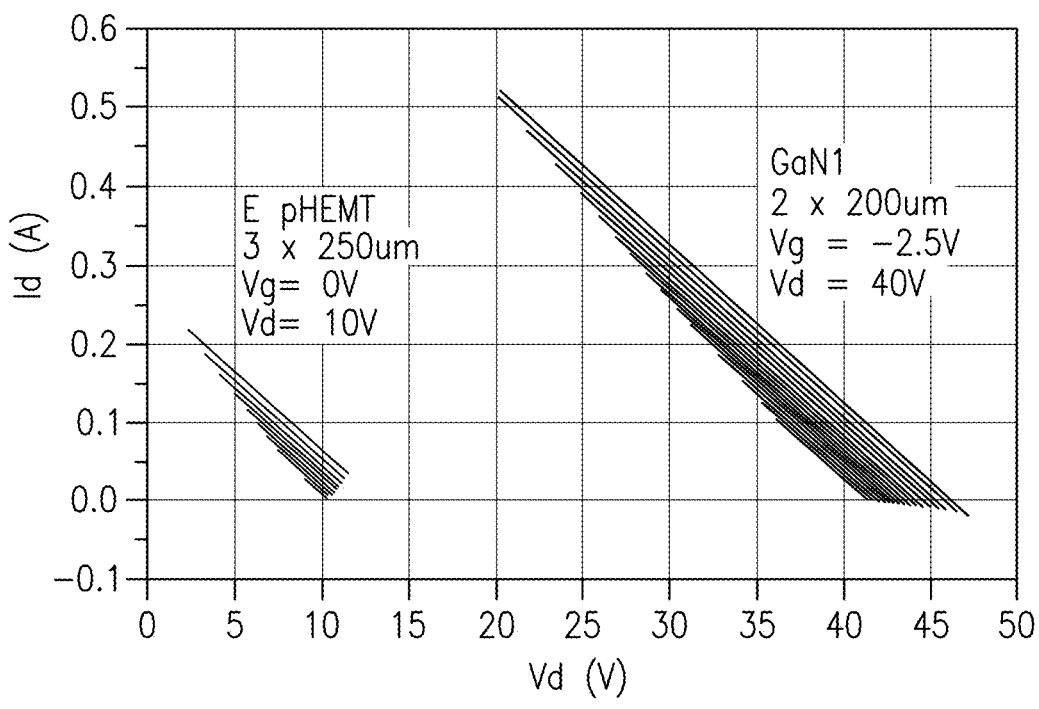
FIG. 7D is a graph of one example of drain current versus drain voltage for the RF amplifier of FIG. 7A.

FIG. 7D is a graph of one example of drain current versus drain voltage for the RF amplifier 190 of FIG. 7A. In this example, the frequency of operation is 3.6 GHz with a frequency spacing of 10 MHz and an input power swept from 0 to 20 dBm. The transistor size, gate biasing voltages, and drain biasing voltages are also annotated in FIG. 7D.

As shown in FIG. 7D, the enhancement mode GaAs FET 152'' has been implemented to have a smaller RF signal swing relative to the GaN FET 151.

Figure 7E:
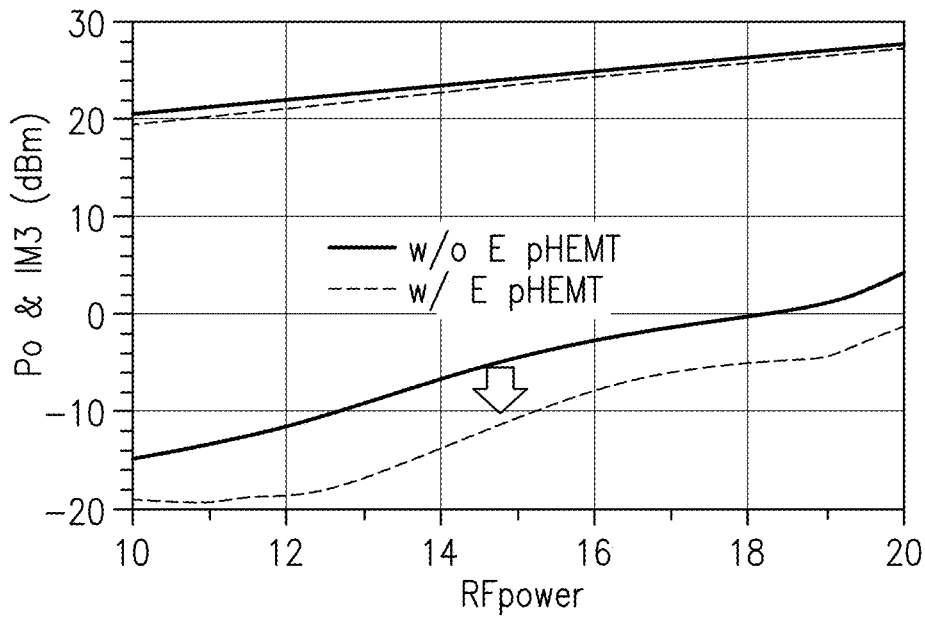
FIG. 7E is a graph of one example of output power and third order intermodulation (IM3) versus RF input power for the RF amplifier of FIG. 7A.

FIG. 7E is a graph of one example of output power and third order intermodulation (IM3) versus RF input power for the RF amplifier 190 of FIG. 7A. In this example, the frequency of operation is 3.6 GHz with a frequency spacing of 10 MHz. Additionally, a 6 dB improvement in IM3 is achieved.

Figure 7F:
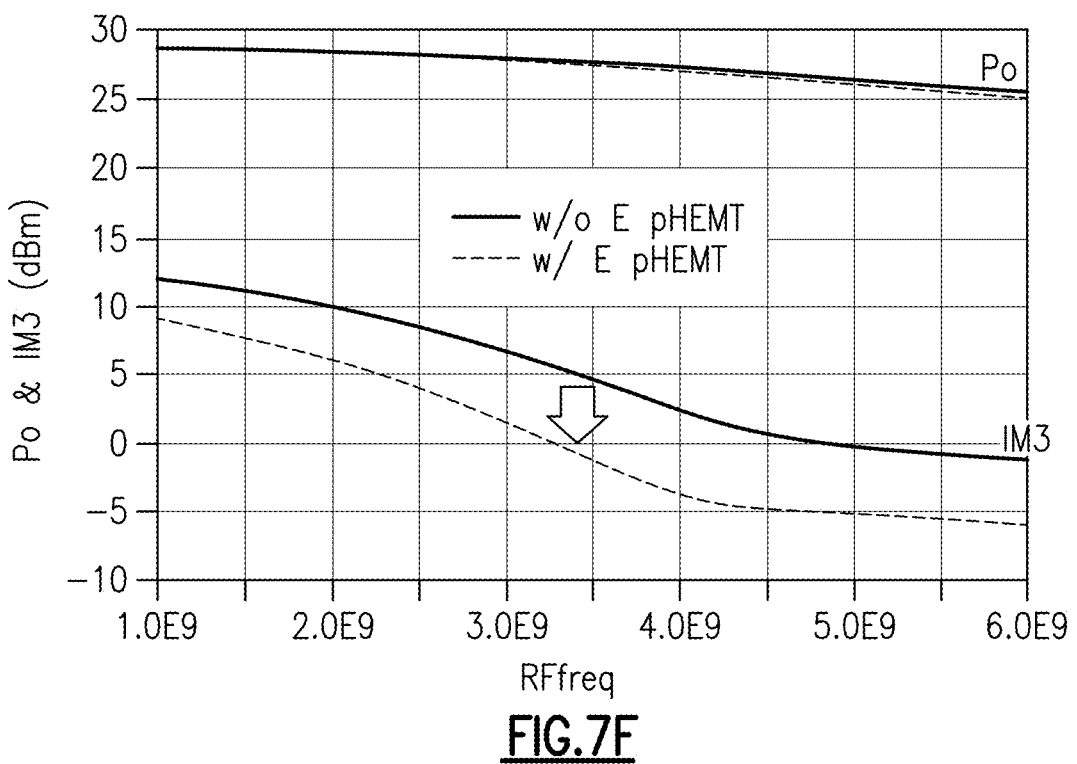
FIG. 7F is a graph of one example of output power and IM3 versus frequency for the RF amplifier of FIG. 7A.

FIG. 7F is a graph of one example of output power and IM3 versus frequency for the RF amplifier 190 of FIG. 7A. In this example, a frequency spacing of 10 MHz is used. Additionally, a 6 dB improvement in IM3 is achieved.

Figure 7G:
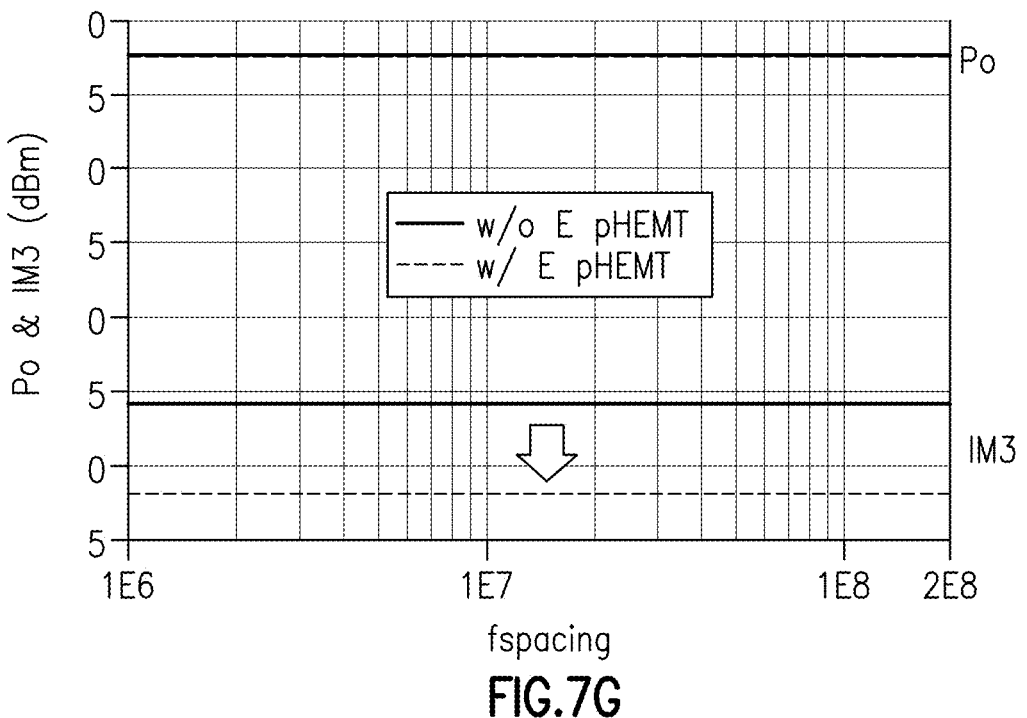
FIG. 7G is a graph of one example of output power and IM3 versus two tone carrier spacing for the RF amplifier of FIG. 7A.

FIG. 7G is a graph of one example of output power and IM3 versus two tone carrier spacing for the RF amplifier 190 of FIG. 7A. In this example, the frequency of operation is 3.6 GHz with an RF input power of 20 dBm. Additionally, a 6 dB improvement in IM3 is achieved.

Figure 8A:
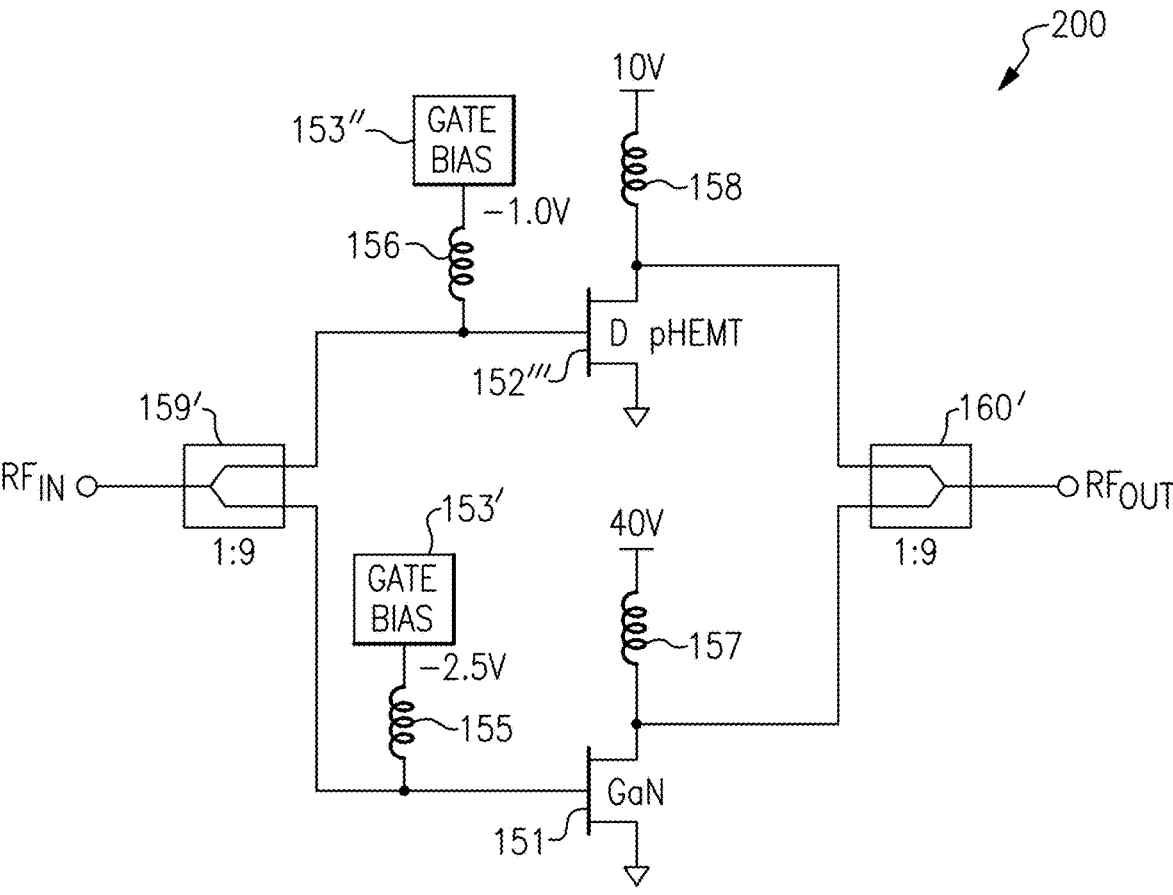
FIG. 8A is a schematic diagram of another embodiment of an RF amplifier.

FIG. 8A is a schematic diagram of another embodiment of an RF amplifier 200. The RF amplifier 200 includes an RF input terminal $RF_{IN}$, an RF output terminal $RF_{OUT}$, a GaN FET 151, a depletion mode (normally on when $V_{GS}$=0V) GaAs pHEMT 152''', a first gate bias circuit 153', a second gate bias circuit 154'', a first gate bias inductor 155, a second gate bias inductor 156, a first choke inductor 157, a second choke inductor 158, an input power splitter 159', and an output power splitter 160'.

In comparison to the RF amplifier 170 of FIG. 5, the RF amplifier 200 of FIG. 8A includes a specific implementation in which the GaAs FET is a depletion mode GaAs pHEMT 152'''. Additionally, the input power splitter and output power combiner have a 1:9 ratio. Furthermore, specific biasing conditions are depicted, including Vg=−2.5V for the gate of the GaN FET 151, $V_{CC1}$=40V for the drain of the GaN FET 151, Vg=−1.0V for the gate of the depletion mode GaAs pHEMT 152''', and $V_{CC2}$=10V for the drain of the depletion mode GaAs pHEMT 152'''.

Figure 8B:
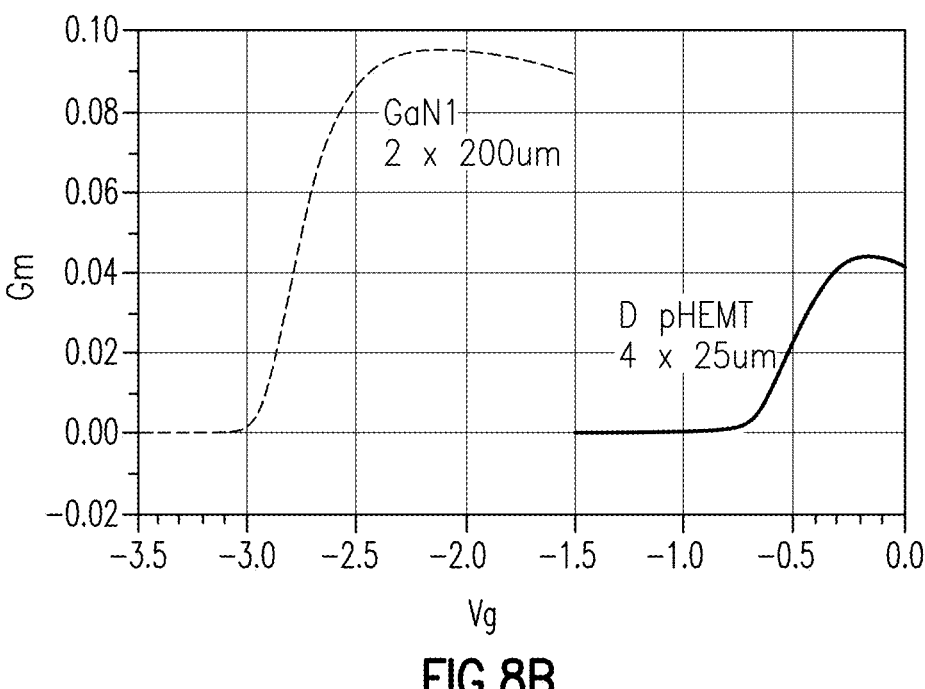
FIG. 8B is a graph of one example of transconductance at fundamental frequency versus gate bias voltage for the RF amplifier of FIG. 8A.

FIG. 8B is a graph of one example of transconductance (Gm) at fundamental frequency versus gate bias voltage for the RF amplifier 200 of FIG. 8A in which the GaN FET 151 has width 2×200 micrometers and the depletion mode GaAs FET 152''' has a width of 4×25 micrometers.

Figure 8C:
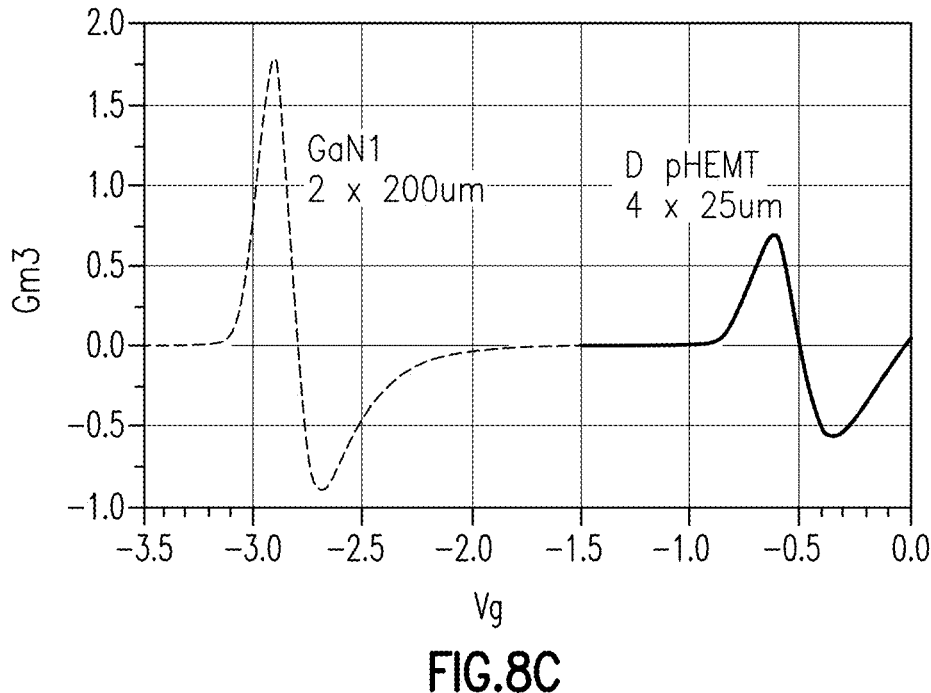
FIG. 8C is a graph of one example of transconductance at third-order harmonic frequency versus gate bias voltage for the RF amplifier of FIG. 8A.

FIG. 8C is a graph of one example of transconductance at third-order harmonic frequency (Gm3) versus gate bias voltage for the RF amplifier 200 of FIG. 8A.

With reference to FIGS. 8B and 8C, by suitable selection of the gate bias voltages for the GaN FET 151 and the GaAs FET 152''', cancellation of Gm3 can be achieved.

Figure 8D:
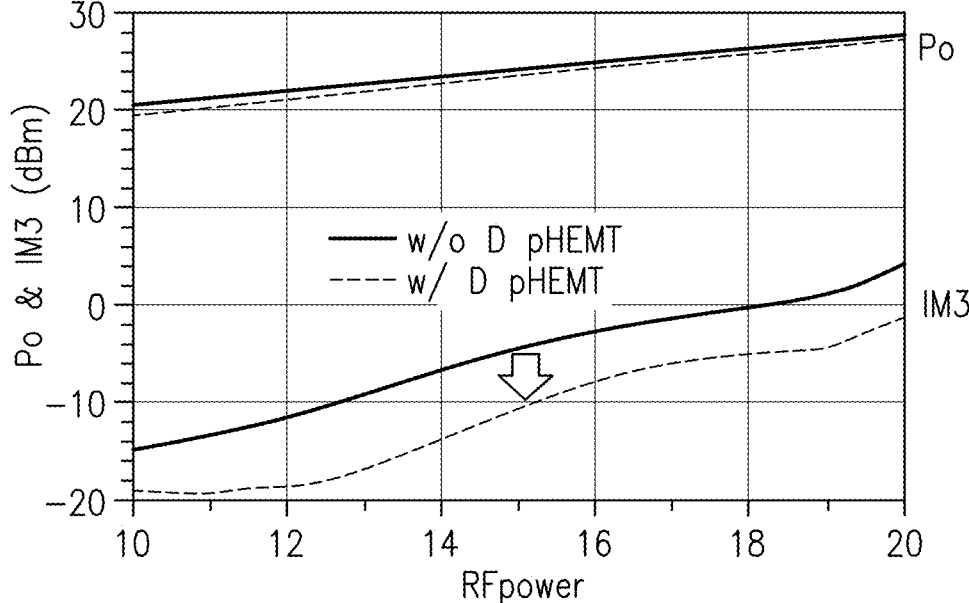
FIG. 8D is a graph of one example of output power and IM3 versus RF power for the RF amplifier of FIG. 8A.

FIG. 8D is a graph of one example of output power and IM3 versus RF power for the RF amplifier 200 of FIG. 8A. In this example, the frequency of operation is 3.6 GHz with a frequency spacing of 10 MHz. Additionally, a 6 dB improvement in IM3 is achieved.

Figure 9:
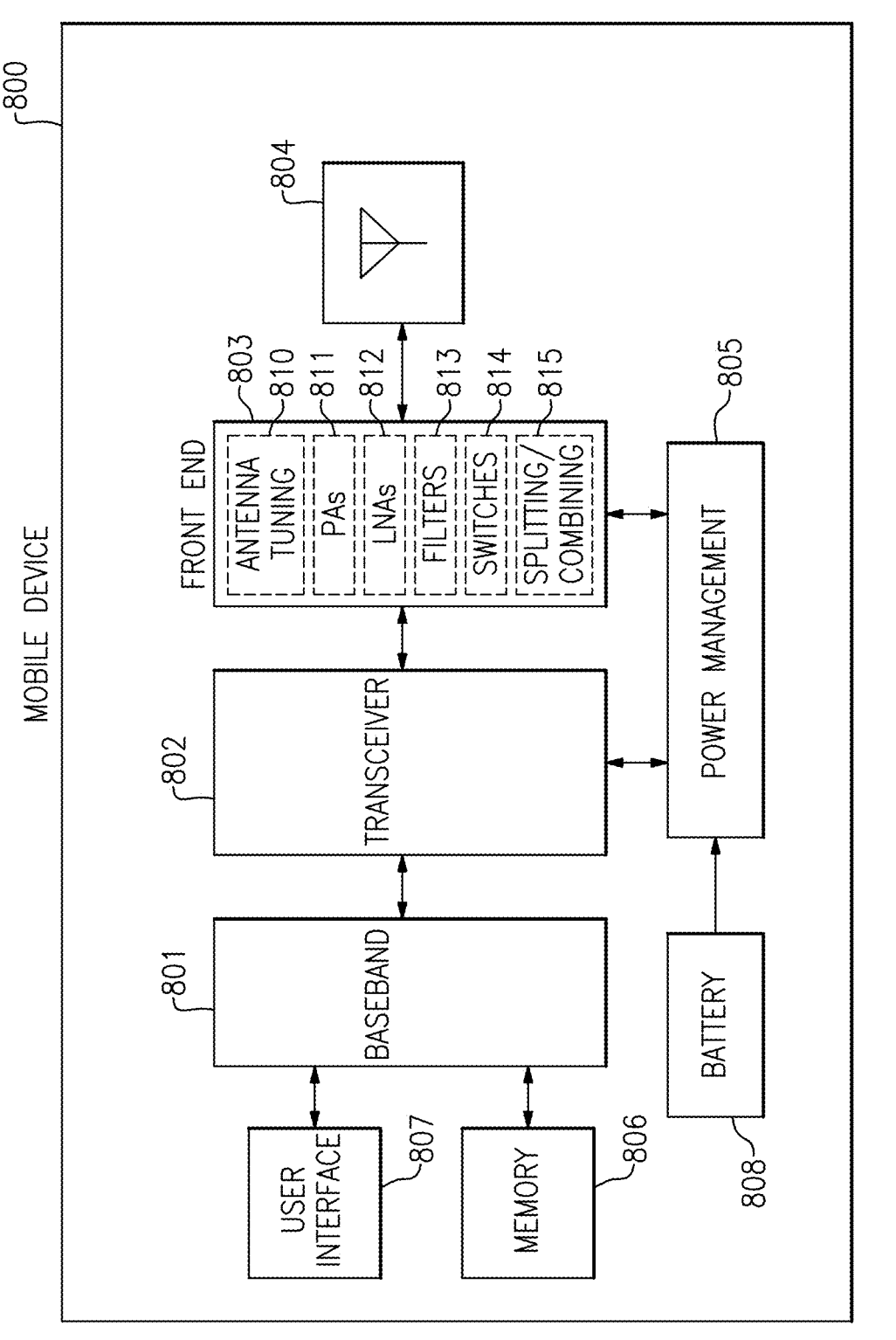
FIG. 9 is a schematic diagram of one embodiment of a mobile device.

FIG. 9 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 9 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible. The front end system 803 can include one or more RF amplifiers implemented in accordance with the present disclosure. For example, one or more of the PAs 811 and/or one or more of the LNAs 812 can be implemented in accordance with the teachings herein.

The front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 9, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 9, the power management system 805 receives a battery voltage from the battery 808. The battery 808 can be any suitable battery for use in the mobile device 800, including, for example, a lithium-ion battery.

Figure 10A:
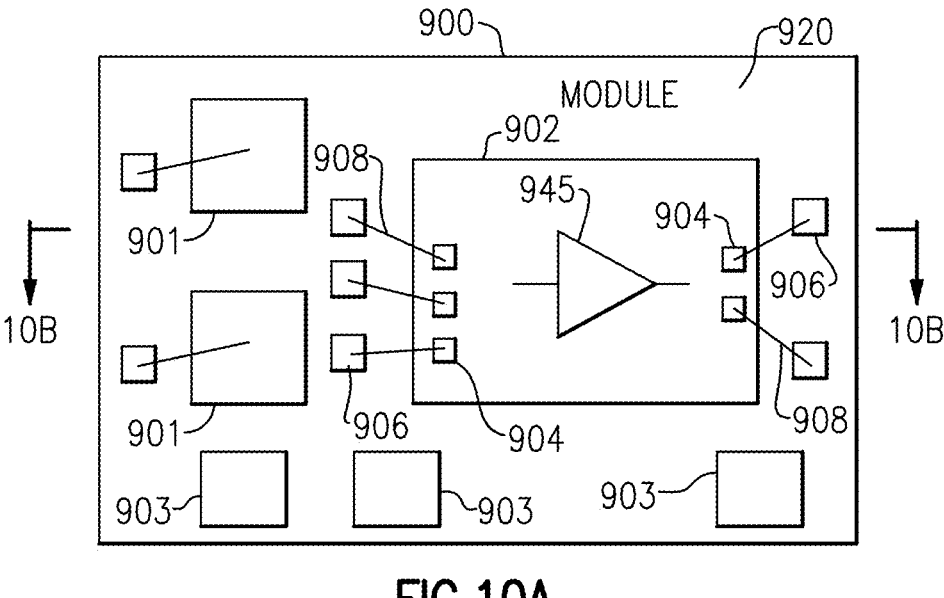
FIG. 10A is a schematic diagram of one embodiment of a packaged module.
Figure 10B:
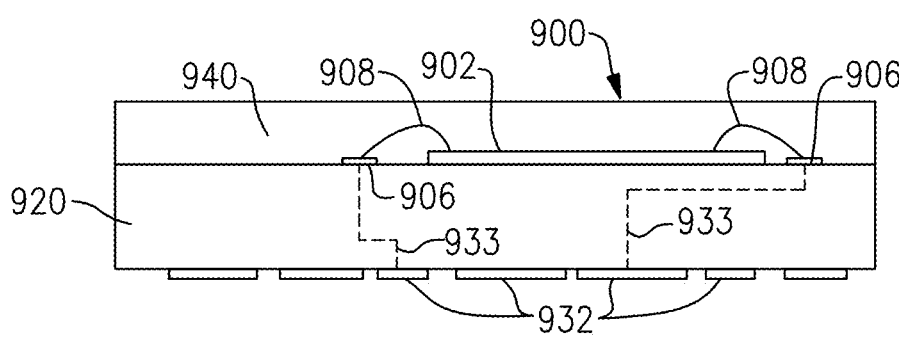
FIG. 10B is a schematic diagram of a cross-section of the packaged module of FIG. 10A taken along the lines 10B-10B.

FIG. 10A is a schematic diagram of one embodiment of a packaged module 900. FIG. 10B is a schematic diagram of a cross-section of the packaged module 900 of FIG. 10A taken along the lines 10B-10B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes an RF amplifier 945, which can be implemented in accordance with one or more features disclosed herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 10B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 10B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

The principles and advantages of the embodiments herein can be used for any other systems or apparatus that have needs for RF amplification. Examples of such apparatus include RF communication systems. RF communications systems include, but are not limited to, mobile phones, tablets, base stations, network access points, customer-premises equipment (CPE), laptops, and wearable electronics. Thus, the RF amplifiers herein can be included in various electronic devices, including, but not limited to, consumer electronic products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency amplifier comprising:
   a radio frequency input terminal configured to receive a radio frequency input signal;
   a radio frequency output terminal configured to output a radio frequency output signal;
   a gallium nitride field-effect transistor having a gate connected to the radio frequency input terminal and a drain connected to the radio frequency output terminal, the gallium nitride field-effect transistor operable to amplify the radio frequency input signal; and
   a gallium arsenide field-effect transistor having a gate connected to the radio frequency input terminal and a drain connected to the radio frequency output terminal, the gallium arsenide field-effect transistor operable to linearize the gallium nitride field-effect transistor.

2. The radio frequency amplifier of claim 1 further comprising an input power splitter configured to split the radio frequency input signal into a first input signal component for the gate of the gallium nitride field-effect transistor and a second input signal component for the gate of the gallium arsenide field-effect transistor.

3. The radio frequency amplifier of claim 2 wherein the input power splitter provides a greater proportion of a signal power of the radio frequency signal to the gate of the gallium nitride field-effect transistor relative to the gate of the gallium arsenide field-effect transistor.

4. The radio frequency amplifier of claim 3 wherein the input power splitter has an asymmetric power ratio of at least 5 to 1.

5. The radio frequency amplifier of claim 2 further comprising an output power splitter configured to combine a first output signal component from the drain of the gallium nitride field-effect transistor and a second output signal component from the drain of the gallium arsenide field-effect transistor.

6. The radio frequency amplifier of claim 1 further comprising a first gate bias circuit configured to bias the gate of the gallium nitride field-effect transistor and a second gate bias circuit configured to bias the gate of the gallium arsenide field-effect transistor.

7. The radio frequency amplifier of claim 6 wherein the first gate bias circuit biases the gate of the gallium nitride field-effect transistor with a greater on voltage than the second gate bias circuit biases the gate of gallium arsenide field-effect transistor.

8. The radio frequency amplifier of claim 1 wherein the gallium arsenide field-effect transistor is a pseudomorphic high electron mobility transistor.

9. The radio frequency amplifier of claim 1 wherein the gallium arsenide field-effect transistor is a depletion type device.

10. The radio frequency amplifier of claim 1 wherein the gallium arsenide field-effect transistor is an enhancement type device.

11. The radio frequency amplifier of claim 1 wherein the drain of the gallium nitride field-effect transistor receives a first power supply voltage and a drain of the gallium arsenide field-effect transistor receives a second power supply voltage that is less than the first power supply voltage.

12. A method of radio frequency amplification, the method comprising:

receiving a radio frequency input signal at a radio frequency input terminal;

amplifying the radio frequency input signal using a gallium nitride field-effect transistor having a gate connected to the radio frequency input terminal and a drain connected to a radio frequency output terminal;

linearizing the gallium nitride field-effect transistor using a gallium arsenide field-effect transistor having a gate connected to the radio frequency input terminal and a drain connected to the radio frequency output terminal; and outputting a radio frequency output signal from the radio frequency output terminal.

13. A mobile device comprising:

a transceiver; and a front-end system coupled to the transceiver, the front-end system including a radio frequency amplifier that includes a radio frequency input terminal configured to receive a radio frequency input signal, a radio frequency output terminal configured to output a radio frequency output signal, a gallium nitride field-effect transistor having a gate connected to the radio frequency input terminal and a drain connected to the radio frequency output terminal, and a gallium arsenide field-effect transistor having a gate connected to the radio frequency input terminal and a drain connected to the radio frequency output terminal, the gallium nitride field-effect transistor operable to amplify the radio frequency input signal, and the gallium arsenide field-effect transistor operable to linearize the gallium nitride field-effect transistor.

14. The mobile device of claim 13 wherein the radio frequency amplifier further includes an input power splitter configured to split the radio frequency input signal into a first input signal component for the gate of the gallium nitride field-effect transistor and a second input signal component for the gate of the gallium arsenide field-effect transistor.

15. The mobile device of claim 14 wherein the input power splitter provides a greater proportion of a signal power of the radio frequency signal to the gate of the gallium nitride field-effect transistor relative to the gate of the gallium arsenide field-effect transistor.

16. The mobile device of claim 15 wherein the input power splitter has an asymmetric power ratio of at least 5 to 1.

17. The mobile device of claim 14 wherein the radio frequency amplifier further includes an output power splitter configured to combine a first output signal component from the drain of the gallium nitride field-effect transistor and a second output signal component from the drain of the gallium arsenide field-effect transistor.

18. The mobile device of claim 13 wherein the radio frequency amplifier further includes a first gate bias circuit configured to bias the gate of the gallium nitride field-effect transistor and a second gate bias circuit configured to bias the gate of the gallium arsenide field-effect transistor.

19. The mobile device of claim 18 wherein the first gate bias circuit biases the gate of the gallium nitride field-effect transistor with a greater on voltage than the second gate bias circuit biases the gate of gallium arsenide field-effect transistor.

20. The mobile device of claim 13 wherein the gallium arsenide field-effect transistor is a pseudomorphic high electron mobility transistor.

\* \* \* \* \*